United States Patent [19]

Allison

[11] Patent Number: 4,567,644
[45] Date of Patent: Feb. 4, 1986

[54] METHOD OF MAKING TRIPLE DIFFUSED ISL STRUCTURE

[75] Inventor: David F. Allison, Los Altos, Calif.

[73] Assignee: Signetics Corporation, Sunnyvale, Calif.

[21] Appl. No.: 673,631

[22] Filed: Nov. 21, 1984

Related U.S. Application Data

[62] Division of Ser. No. 451,138, Dec. 20, 1982, abandoned.

[51] Int. Cl.$^4$ .................. H01L 21/263; H01L 27/04; H01L 7/44
[52] U.S. Cl. .................. 29/576 B; 29/578; 148/1.5; 148/187; 148/DIG. 10; 357/34; 357/91
[58] Field of Search .............. 29/576 B, 578; 148/1.5, 148/187; 357/34, 91

[56] References Cited

U.S. PATENT DOCUMENTS

| | | | |
|---|---|---|---|
| 3,283,170 | 9/1961 | Buie | 357/36 |
| 3,798,079 | 3/1974 | Chu et al. | 148/190 |
| 3,860,460 | 1/1975 | Olsoxi | 148/186 |
| 3,885,994 | 5/1975 | Miller | 148/1.5 |
| 3,915,767 | 10/1975 | Welliver | 148/190 |
| 4,005,470 | 1/1977 | Tucci et al. | 357/36 |
| 4,111,720 | 9/1978 | Michel et al. | 148/1.5 |
| 4,151,009 | 4/1979 | Ogureck et al. | 148/1.5 |
| 4,239,558 | 12/1980 | Morishita et al. | 357/48 |
| 4,412,376 | 11/1983 | De Bar et al. | 29/576 B |
| 4,456,488 | 6/1984 | Gahle | 148/1.5 |
| 4,477,965 | 10/1984 | Blossfeld | 29/576 B |

FOREIGN PATENT DOCUMENTS 2062349 5/1981 United Kingdom .

OTHER PUBLICATIONS

Peltier, IEEE International Solid State Circuits Conference, Digest of Technical Papers, Feb. 1975, pp. 168–169.

IEEE Journal of Solid-State Circuits, vol. SC-15, No. 3, Jun. 1980, "Performance, Temperature Behavior, and First Order Modeling of ISL"–J. Lohstroh et al., pp. 269–276.

IEEE Journal of Solid-State Circuits, vol. SC-14, No. 3, Jun. 1979, "ISL, A Fast and Dense Low-Power Logic, Made in a Standard Schottky Process"–J. Lohstroh, pp. 585–590.

Electronics, Jun. 8, 1978, pp. 41–42, "Two Popular Bipolar Technologies Combine in Philips' Device".

*Primary Examiner*—Roy Upendra
*Attorney, Agent, or Firm*—J. A. Dinardo; R. J. Meetin; R. T. Mayer

[57] ABSTRACT

An ISL structure is fabricated by a process in which impurities are introduced into a semiconductor substrate (10) of first type conductivity (P) to form major and minor portions (18 and 18a) of a first region of opposite second type conductivity (N). The minor portion has a lower net impurity concentration than the major portion and extends to a considerably lesser depth. An impurity is introduced into the major and minor portions to form a second region (24) of first type conductivity. An impurity is introduced into the second region to form a third region (30) of second type conductivity spaced laterally apart from the minor portion. Metallization is then performed to create at least one Schottky rectifying contact (32) with the major portion and ohmic contacts (38, 36, and 34) with the substrate and second and third regions.

15 Claims, 7 Drawing Figures

METHOD OF MAKING TRIPLE DIFFUSED ISL STRUCTURE

This is a division of U.S. patent application Ser. No. 451,138, filed Dec. 20, 1982, now abandoned.

BACKGROUND OF THE INVENTION

This invention relates to integrated Schottky logic (ISL) semiconductor circuits, and more particularly to an improved form of structure fabricated by triple diffusion.

In Electronics, pages 44–42, June 8, 1978 and in IEEE Journal of Solid State Circuits, Vol. SC-14, No. 3, pages 585–590, June 1979, there is described a new type of LSI logic known as ISL, an abbreviation for integrated Schottky logic. Briefly, an ISL gate comprises the combination of a current source, a normally operated, i.e. collector down, vertical npn switching transistor merged with a pnp transistor and a set of Schottky output diodes. The pnp transistor, which may have a lateral component in addition to a vertical component, clamps the npn transistor so as to prevent it from going too deeply into saturation.

Heretofore, all proposals for an ISL structure have utilized an epitaxial layer in which the components of the logic are combined. One disadvantage of the epitaxial layer form of structure is that the thickness of the epitaxial layer is a limiting factor in minimizing the base width, or thickness, of the pnp clamping transistor. The base width, in turn, limits the current gain $\beta_f$ of the pnp clamping transistor and thereby has a limiting effect on the switching speed of the npn transistor.

SUMMARY OF THE INVENTION

Briefly, an ISL structure in accordance with the invention is produced by means of a triple diffusion process rather than an epitaxial process. Triple diffusion means that the collector, base, and emitter of the ISL switching transistor are formed in separate diffusion steps. The base of the ISL clamping transistor is formed by two successive diffusions whose depth can be more readily controlled to produce a very narrow base width, thereby improving the current gain $\beta_f$ by a typical factor of 3 over the epitaxial counterpart.

Starting with a semiconductor substrate of first type conductivity, a first surface diffusion region of second type conductivity is formed within a surface of the substrate. The first diffusion region has a major portion extending a substantial depth below the substrate surface and a laterally adjoining minor portion extending below the substrate surface to a depth that is considerably less than the depth of the major portion. The minor portion has a lighter doping concentration than the major portion.

A second surface diffusion region of first type conductivity is formed within the first surface diffusion region extending into both major and minor portions. A third surface diffusion region of second type conductivity is formed within the second surface diffusion region so that it overlies the major portion of the first diffusion region but is spaced apart from the minor portion. A circumscribing region of first type conductivity of heavier doping concentration than the substrate is formed within the substrate surrounding and extending partly into the first surface diffusion region.

Means forming one or more Schottky diodes are formed on the surface of the major portion of the first surface diffusion region. Means forming ohmic contacts are provided on the third surface diffusion region, on the second surface diffusion region overlying the minor portion of the first surface diffusion region but spaced laterally from the major portion of the first surface diffusion region, and on the circumscribing region, respectively.

DESCRIPTION OF THE PREFERRED EMBODIMENT

Figure 1:
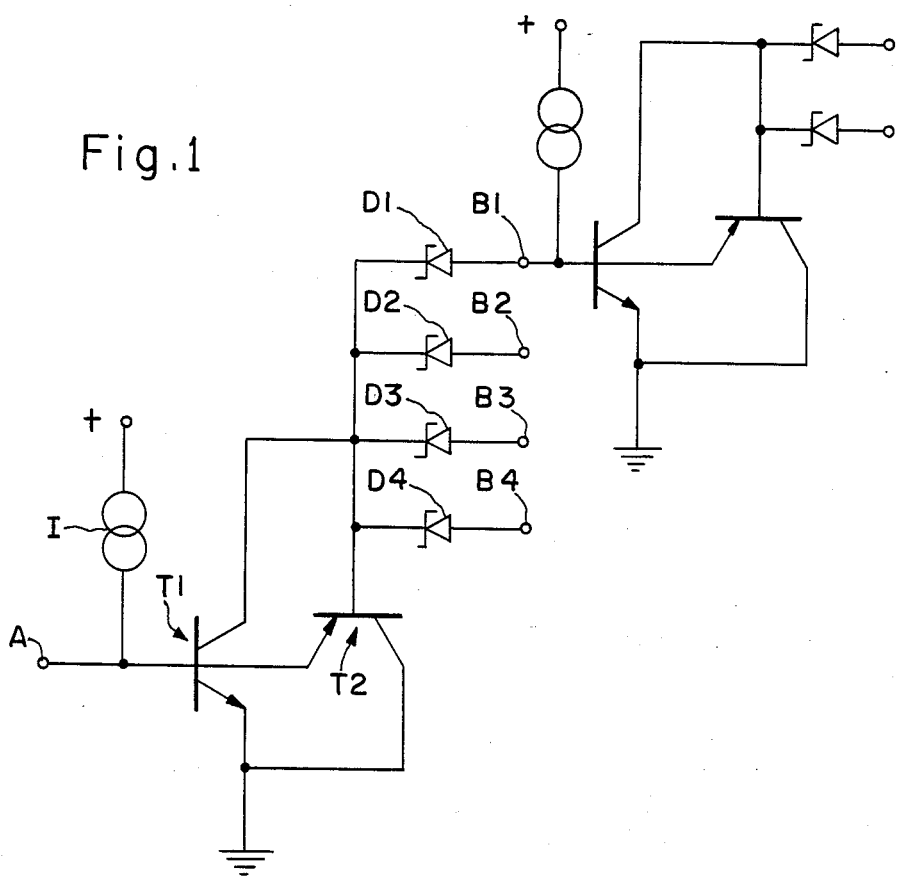
FIG. 1 is a schematic circuit diagram of a basic ISL gate.

FIG. 1 shows a schematic circuit diagram of a basic ISL gate. A current source I and an input signal terminal A are connected to the base of an npn inverter or switching transistor T1. Multiple outputs are obtained from the npn inverter transistor T1 by coupling the collector to the cathodes of a plurality of Schottky diodes D1, D2, D3, D4, and taking the outputs from the anodes thereof at output terminals B1, B2, B3, and B4, respectively. One or more of the outputs, such as at terminal B1, may be coupled to succeeding ISL gates, such as the one shown.

The npn inverter transistor T1 is clamped by a pnp transistor T2 to keep it from going too deeply into saturation. In practice, the pnp clamping transistor T2 may be a vertical or a lateral transistor, or a combination of the two, sharing common regions with the npn inverter transistor T1. For example, the emitter and the base of the pnp clamping transistor T2 may comprise the base and the collector, respectively, of the npn inverter transistor T1.

It has not heretofore been proposed to embody ISL logic other than in an epitaxial structure. This invention is predicated in part on the recognition that a simplified process technology and better operating performance of the ISL logic gate can be realized by embodying an ISL gate in a structure formed by a triple diffusion process.

Figure 2:
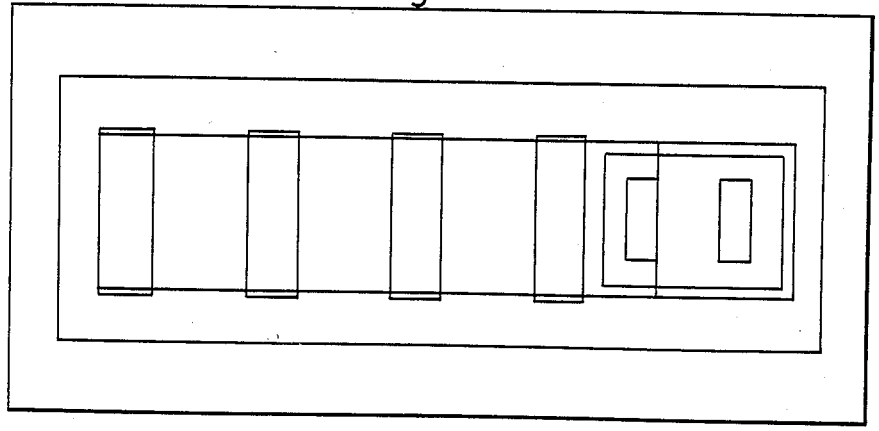
FIG. 2 is a top plan view of a composite mask layout for the triple diffused ISL structure according to the invention.

Reference is now made to FIGS. 2–7 for a description of a triple diffusion process for fabricating an ISL gate according to the invention. FIG. 2 is a top plan view of a composite mask layout and FIGS. 3–7 are sectional views illustrating the sequential process steps for fabricating the triple diffused ISL structure.

Figure 3:
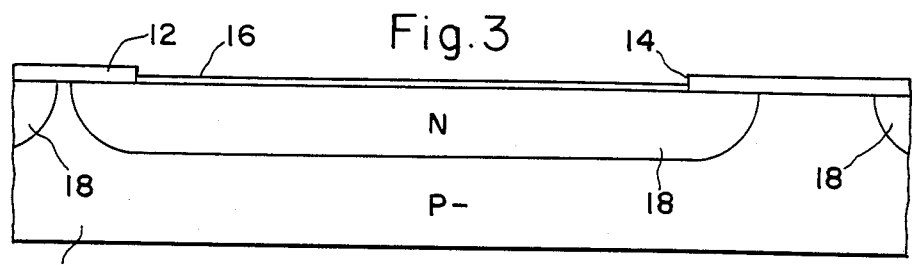

As shown in FIG. 3, a substrate 10 of monocrystalline semiconductor material, such as silicon, is provided with a light doping of P type impurity, such as boron. The P type doping is uniform and may have a doping concentration of $10^{15}$ atoms per cubic centimeter. The surface of the substrate 10 is provided with a first thermal oxide layer 12, which may be grown by subjecting the substrate 10 to a temperature of 1050° C. for about 3 hours and 34 minutes to achieve an oxide layer thickness of 6,000 angstroms.

After the first oxide layer 12 is formed, it is patterned photolithographically to produce an opening 14 through which the impurities for the collector diffusion can be introduced. Since it is preferable to implant dopant impurities through a thin oxide layer for screening purposes, a thin oxide layer 16 is formed on the surface of the substrate 10 where the collector is to be formed. The thin oxide layer 16 may be formed by etching the first oxide layer 12 down to the desired thickness. Alternatively, the first oxide layer 12 may be removed entirely from the substrate surface within the opening 14 and a new thin oxide layer 16 may be regrown by subjecting the substrate 10 to a temperature of 1000° C. for 34 minutes to achieve a desired thickness of 550 angstroms.

A collector implant step is next performed by implanting an n type dopant, such as phosphorus, through the thin oxide layer 16. The total dose of phosphorus atoms is preferably $6.4 \times 10^{13}$ atoms per square centimeter. The phosphorus implant is followed by a drive-in diffusion at 1200° C. for 5 hours and 40 minutes, driving the n type impurity atoms to a depth of about 7 micrometers. The collector tub or n type region thus produced is shown at 18. A number of such collector regions 18 may be formed simultaneously with each other, some of which may be provided with resistors such as for the current source I shown in FIG. 1. A portion of one such additional collector region or tub 18 is shown on the right and a portion of another one is shown on the left.

Figure 4:
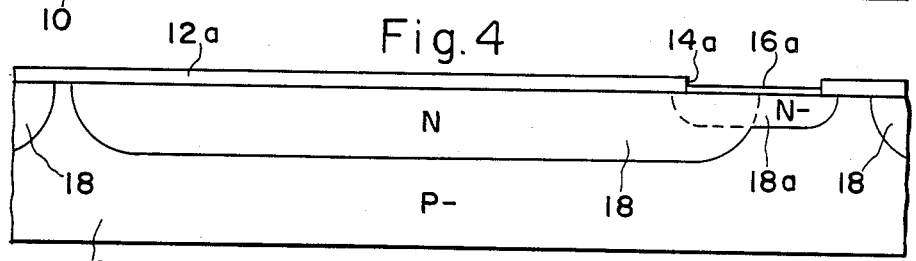

After the collector tubs 18 are formed, the oxide layers 12 and 16 are stripped, and a new thick oxide layer 12a is regrown. At this time, a new opening 14a is produced for the introduction of a lighter concentration of n type impurity which is to form a short, thin n- region 18a. Prior to the impurity introduction, however, a new thin oxide layer 16a is grown, as shown in FIG. 4. The n- region 18a forms a thin extension of the main collector region 18. The new opening 14a with the thin oxide layer 16a has an inner edge lying over the collector region 18 that is coincident with the right hand edge of the previous opening 14 shown in FIG. 3. The width of the new opening 14a is at least about twice as long as the depth of the main collector region 18, so that the right hand edge of the new opening 14a and the left hand edge of the new opening 14a are approximately equidistant from the outermost surface edge of the main collector region 18.

To form the thin n- region 18a a light implant of phosphorus atoms is made through the thin oxide layer 16a. The phosphorus dose is typically $4 \times 10^{12}$ atoms per square centimeter. Following the implantation, the phosphorus atoms are driven at 1,000° C. to a depth of 2 micrometers. During the drive-in diffusion a part of the driven phosphorus atoms diffuse into the already formed collector region 18, as shown by the dashed lines, while the other part of the driven atoms diffuse into the substrate 10 and form the thin extension 18a adjoining the main collector region 18, but still spaced from the adjacent collector region 18.

Figure 5:
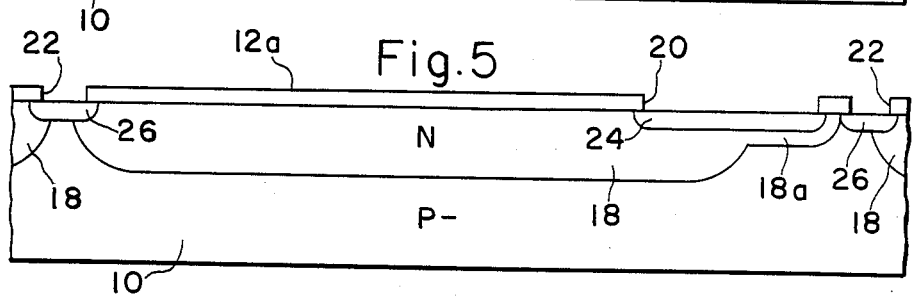

FIG. 5 shows the next series of steps in the fabrication process. New openings 20 and 22 are formed within the oxide layer 12a. The single opening 20 is formed to expose both a part of the thin collector region 18a and an adjoining part of the main collector region 18. The smaller annular opening 22 is formed to expose surface areas of the substrate between adjacent collector regions 18.

After the openings 20 and 22 are formed, a p type diffusion is made through the openings 20 and 22 to produce a base region 24 and an annular channel stop region 26. The p type diffusion is done as follows. First, the p type dopant, such as boron, is deposited on the exposed surfaces by passing a boron containing gas, such as boric acid, $HBO_2$ over the semiconductor surface while the substrate is heated at 930° C. for 1 hour and 42 minutes. Finally, a drive-in diffusion is made in an oxidizing atmosphere at a substrate temperature of 1050° C. for 45 minutes to drive the p type impurities in regions 24 and 26 to a depth of 1 micrometer and simultaneously grow 4,000 angstroms of oxide.

The channel stop region 26 is a p+ region and acts to prevent leakage of charge carriers between the adjacent tubs 18 by preventing an n type inversion layer from forming in these regions. The channel stop region 26 overlaps the collector region 18 and the next adjacent collector tub 18 and is also closely spaced to the thin collector region 18a. The base region 24 lies partly in the thin collector region 18a and partly in the main collector region 18.

During the base drive-in step, an oxide layer forms over the openings 20 and 22, thereby completely covering the semiconductor surface with the oxide layer 12a. While the oxide layer 12a after the base drive-in diffusion may be thinner over the base region 24 and the channel stop region 26 than in the other regions, for drawing simplicity it is shown uniformly thick in FIG. 6.

Figure 6:
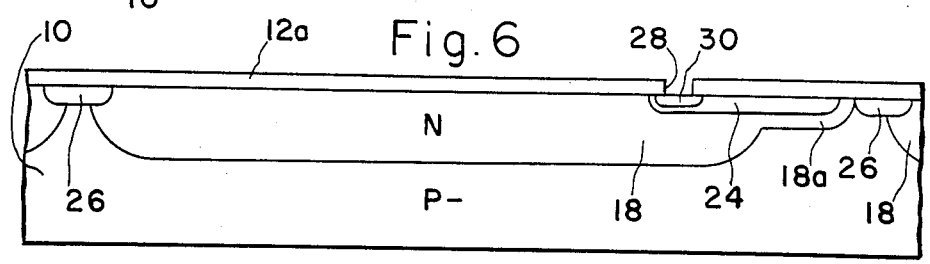

FIG. 6 shows the next step, in which an opening 28 is formed in the oxide layer 12a. The opening 28 lies over the part of the base region 24 lying within the main collector region 18. After the opening 28 is formed, a heavy doping of n type impurity, such as phosphorus, is deposited on the area of the base region 24 that is exposed through the opening 28. The substrate is heated at 930° C. for 2 hours and 20 minutes during the phosphorus deposition and cause the phosphorus to diffuse into region 24, to form an emitter region 30 beneath the opening 28. Thereafter the emitter region 30 is annealed by heating the substrate at 800° C. for 42 minutes. The depth of the emitter region 30 is 8,000 angstroms. During the emitter annealing step, a thin oxide layer forms over the emitter region 30.

Figure 7:
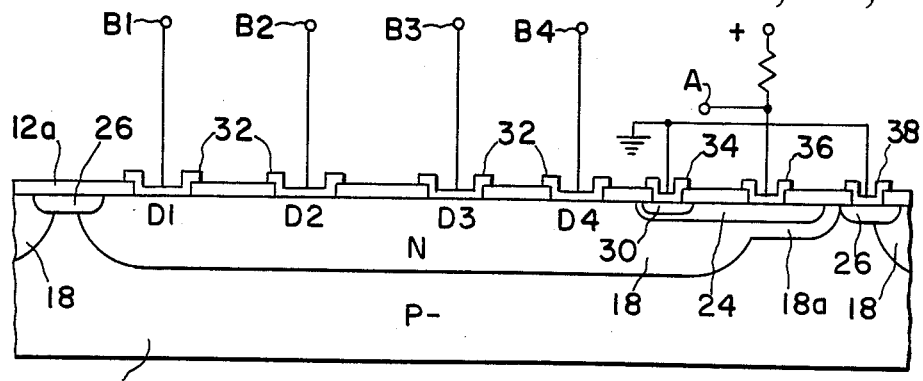
FIGS. 3–7 are sectional views illustrating the process steps for fabricating the triple diffused ISL structure according to the invention.

The next series of steps comprising metallization is shown in FIG. 7 wherein multiple openings are formed in the oxide layer 12a over the main collector region 18 where four Schottky diodes are to be formed, and single openings are provided over the emitter region 30, over the base region 24 and over the channel stop region 26 adjoining the thin collector region 18a. The contact metallization is preferably multilayered, there being a first platinel silicide layer making direct contact to the silicon, followed by a barrier layer of titanium tungsten, and then a layer of aluminum. The metallization layers are patterned to form four contacts 32 for the Schottky diodes on the main collector region 18, an emitter contact 34 on the emitter region 30, a base contact 36 on the base region 24, and a collector contact 38 for the pnp clamping transistor, which will be further described.

The platinel silicide layer which is formed directly on the semiconductor surface may comprise a ternary alloy of 50% silicon, 44% nickel, and 6% platinum. The platinel silicide alloy may be produced by sputter depositing a composition of 88% nickel and 12% platinum on the silicon and heating the silicon to form the ternary alloy. A process for producing the platinel silicide contacts is disclosed in U.S. Pat. No. 3,855,612 to Rosvold. This process produces a platinum-nickel-silicon ternary alloy on the semiconductor surface. In the n type collector region 18 it forms a Schottky barrier contact for the four Schottky diodes D1 through D4 of FIG. 1. In the other regions it forms ohmic contacts to the emitter region 30, the base region 24, and the pnp collector at the channel stop region 26.

The titanium tungsten barrier layer between the platinel silicide and the aluminum layer prevents the aluminum from diffusing into the platinel silicide and silicon. The aluminum is preferred for its high conductivity and low melting point.

Other processing steps which are well known in the art include the application of a low melting point phospho-silicate glass layer over the aluminum contacting layer, a top aluminum layer for supply conductors and interconnects, and a passivating layer of phospho-silicate glass.

The npn inverter transistor T1 of FIG. 1 is constituted in FIG. 7 by the emitter region 30, base region 24, and collector region 18. The pnp clamping transistor T2 has a vertical component constituted by the region 24 as the emitter, the thin region 18a as the base, and the substrate 10 as the collector. The pnp clamping transistor T2 also has a lateral component including the region 24 as emitter, the thin region 18a as the base, and the channel stop region 26 as the collector, with the lateral spacing at the surface between regions 24 and 26 determining the base thickness of the lateral clamping component.

It will be seen that the thickness of the thin region 18a which forms the base of the pnp clamping transistor is not limited by the thickness of an epitaxial layer of the prior art. The thickness of the pnp clamping transistor is determined by the difference in thickness between the two diffused regions 18a and 24. Since the depth of both these regions 18a and 24 can be controlled by both the temperature and the length of time of diffusion, a wider range of control over the base thickness is afforded. More importantly, the small thickness achievable can be very thin, as small as a few thousand angstroms.

An important beneficial result that flows from a small base thickness for the pnp clamping transistor is that its current gain $\beta_f$ can be increased substantially. Experimental results have shown that the current gain $\beta_f$ can be increased by a factor of 3 over a corresponding epitaxial structure.

In FIG. 7, the electrical connections to the various elements of the triple diffused structure are shown schematically with reference characters corresponding to those of FIG. 1. In practice, these connections, for the most part, would be made during the second metallization. The current source I of FIG. 1 is shown in FIG. 7 as a resistor coupled to a positive supply. The current source resistor may be present in an adjacent resistor tub and may be formed during the same diffusion steps in the process that forms the regions 24 and 26, often referred to as the base diffusion of the npn transistor.

The triple diffused structure produced according to the invention has several important advantages. The increased current gain $\beta_f$ for the pnp clamping transistor offers a speed improvement for switching the npn inverter or switching transistor. Because the triple diffusion process is simpler than the epitaxial process, it should result in lower cost and higher yield.

What I claim is:

1. A method of fabricating a semiconductive structure from a monocrystalline semiconductor substrate of first type conductivity, the method comprising the steps of:

forming a first region of second type conductivity opposite to the first type conductivity in the substrate along an upper surface thereof by the steps of (1) introducing a first impurity of second type conductivity into the substrate to form a major portion of the first region and (2) introducing a second impurity of second type conductivity into the substrate to form a minor portion of the first region contiguous with the major portion but having a lower net impurity concentration than the major portion and extending considerably less than it below the upper surface;

introducing an impurity of first type conductivity into the substrate to form a second region of first type conductivity inside the location for semiconductive boundary of the first region, the second region extending into the locations for both the major and minor portions to a depth less than that of the minor portion;

introducing an impurity of second type conductivity into the substrate to form a third region of second type conductivity inside the location for the semiconductive boundary of the second region laterally spaced apart from the location for the minor portion; and depositing metallic material on the substrate to form at least one Schottky rectifying contact with the major portion outside the second region, an ohmic contact with the third region, an ohmic contact with the second region outside the third region, and an ohmic contact with the substrate outside the first region.

2. A method as in claim 1 wherein the first type conductivity is p type.

3. A method as in claim 1 further including the step of introducing an impurity of first type conductivity into the substrate to form a circumscribing region of first type conductivity merging with the first region along its upper lateral boundary.

4. A method as in claim 1 wherein the ohmic contact to the second region is laterally spaced apart from the major portion.

5. A method as in claim 1 wherein the steps of introducing the impurities comprise diffusing them.

6. A method as in claim 1 wherein the step of forming the first region comprises the steps of:

initially introducing the first impurity into part of the major portion and then heating the substrate to diffuse the first impurity further into the major portion; and subsequently introducing the second impurity into part of the minor portion and then heating the substrate to diffuse the second impurity further into the minor portion.

7. A method as in claim 2 wherein the substrate is substantially silicon.

8. A method as in claim 3 wherein the ohmic contact to the substrate is made to the circumscribing region.

9. A method as in claim 4 wherein the first type conductivity is p type.

10. A method as in claim 5 wherein the minor portion and the second region are respectively formed to depths of about 2 micrometers and 1 micrometer.

11. A method as in claim 6 wherein the steps of introducing the first and second impurities into the parts of the major and minor portions are performed by ion implantation.

12. A method as in claim 6 wherein the first type conductivity is p type.

13. A method as in claim 8 wherein the steps of introducing the impurities of first type conductivity are done simultaneously with the same impurity of first type conductivity.

14. A method as in claim 10 wherein the first type conductivity is p type.

15. A method as in claim 13 wherein the first type conductivity is p type.

* * * * *